(12) United States Patent
Poelzl et al.

(10) Patent No.: US 7,816,210 B2
(45) Date of Patent: Oct. 19, 2010

(54) METHOD FOR PRODUCING A TRENCH TRANSISTOR AND TRENCH TRANSISTOR

(75) Inventors: Martin Poelzl, Ossiach (AT); Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 559 days.

(21) Appl. No.: 11/512,749

(22) Filed: Aug. 30, 2006

(65) Prior Publication Data

US 2007/0059887 A1   Mar. 15, 2007

(30) Foreign Application Priority Data

Aug. 30, 2005   (DE) .................. 10 2005 041 108

(51) Int. Cl.
*H01L 21/336*   (2006.01)

(52) U.S. Cl. ................ 438/271; 438/270; 438/272; 438/259; 438/589; 257/E29.26; 257/E29.257; 257/E29.262; 257/331; 257/332

(58) Field of Classification Search .......... 438/271, 438/272, 259, 589, 258, 212; 257/302, 331, 257/332, E29.26, E29.257, E29.262
See application file for complete search history.

(56) References Cited

U.S. PATENT DOCUMENTS

| 4,941,026 | A |  | 7/1990 | Temple |  |
|---|---|---|---|---|---|
| 5,283,201 | A |  | 2/1994 | Tsang et al. |  |
| 5,560,804 | A | * | 10/1996 | Higuchi et al. | 438/719 |
| 5,973,360 | A |  | 10/1999 | Tihanyi |  |
| 2003/0080379 | A1 |  | 5/2003 | Oikawa et al. |  |
| 2004/0262677 | A1 | * | 12/2004 | Harada | 257/329 |
| 2005/0145936 | A1 | * | 7/2005 | Polzl et al. | 257/341 |
| 2005/0242392 | A1 | * | 11/2005 | Pattanayak et al. | 257/328 |
| 2006/0017056 | A1 | * | 1/2006 | Hirler | 257/77 |

FOREIGN PATENT DOCUMENTS

DE   10234 996 A1   10/2003

* cited by examiner

*Primary Examiner*—Thanh V Pham
*Assistant Examiner*—Maria Ligai
(74) *Attorney, Agent, or Firm*—Maginot, Moore & Beck

(57) ABSTRACT

A method is disclosed for producing a trench transistor which has at least two trenches with in each case a field electrode arranged therein and a gate electrode arranged therein. In the method, it is provided to implement the trenches with different trench widths and then to produce the field electrodes by filling up the trenches with an electrode material and subsequent cutting back of the electrode material. The different trench width leads to different etching rates during the cutting back of the electrode material, and thus to field electrodes which are spaced apart from a top edge of the trenches by different amounts. Following this, the gate electrodes are produced which, due to the different dimensions of the field electrodes, extend into the trenches to a different depth, resulting in different gate capacitances for the gate electrodes in the two trenches.

9 Claims, 10 Drawing Sheets

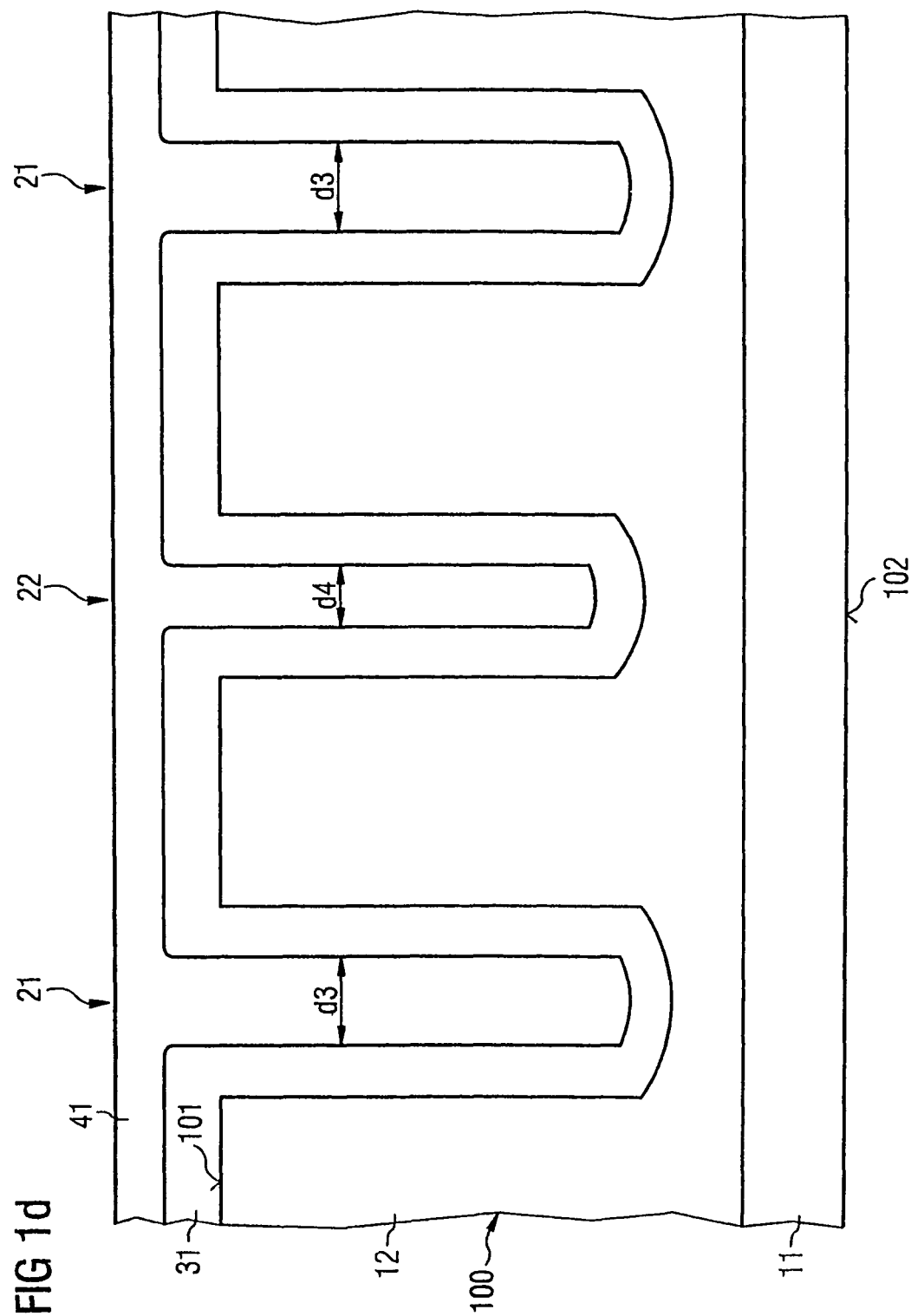

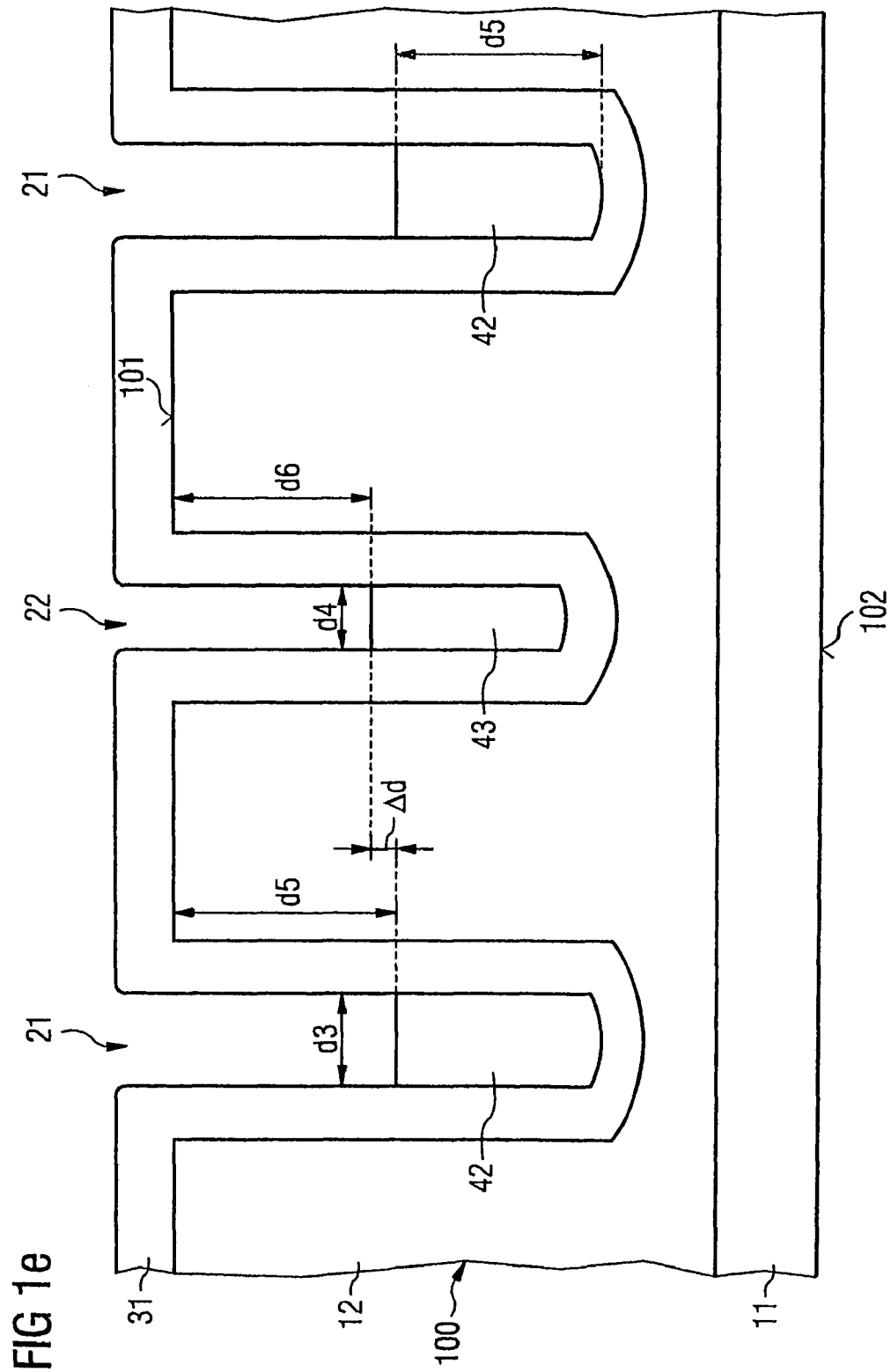

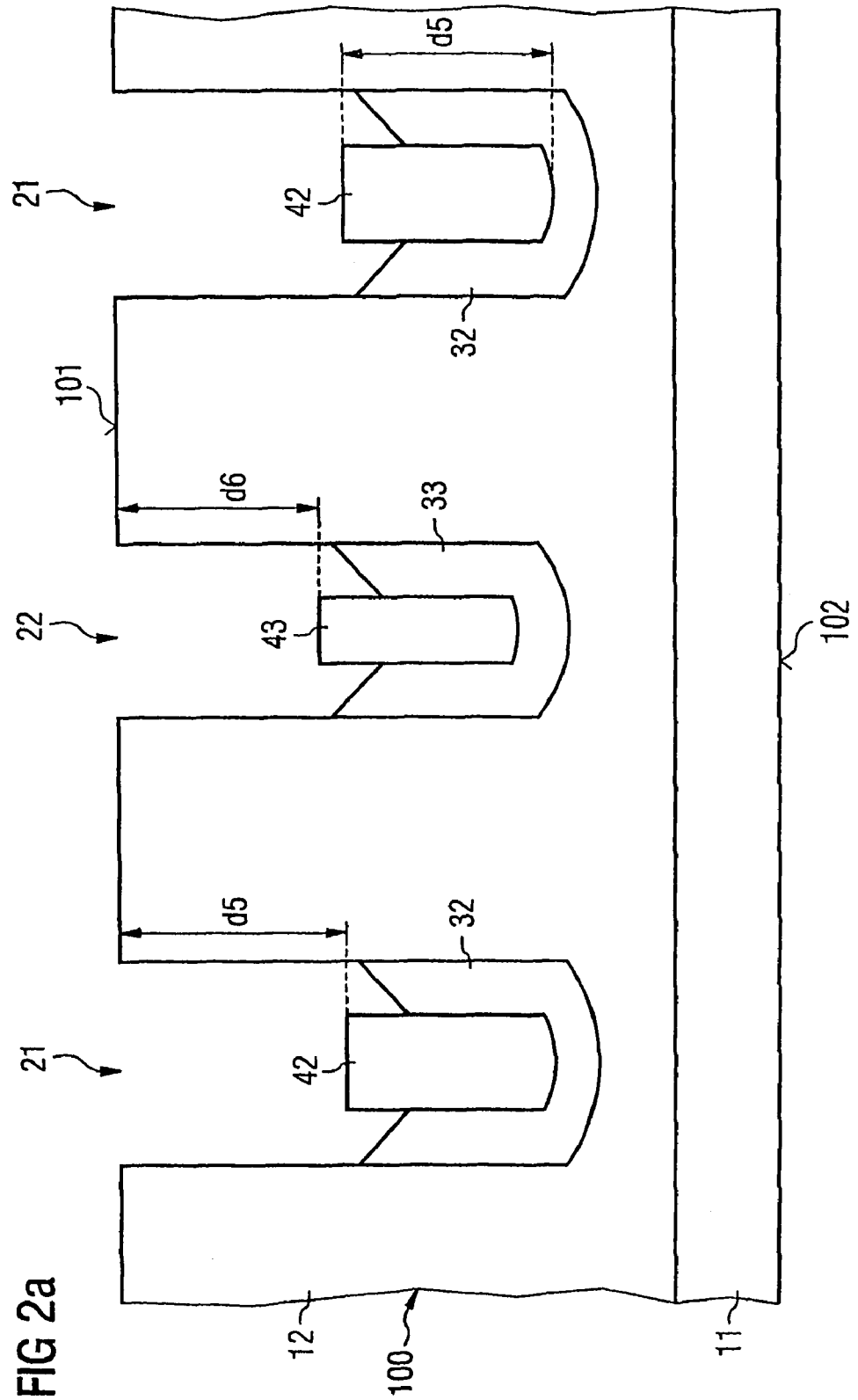

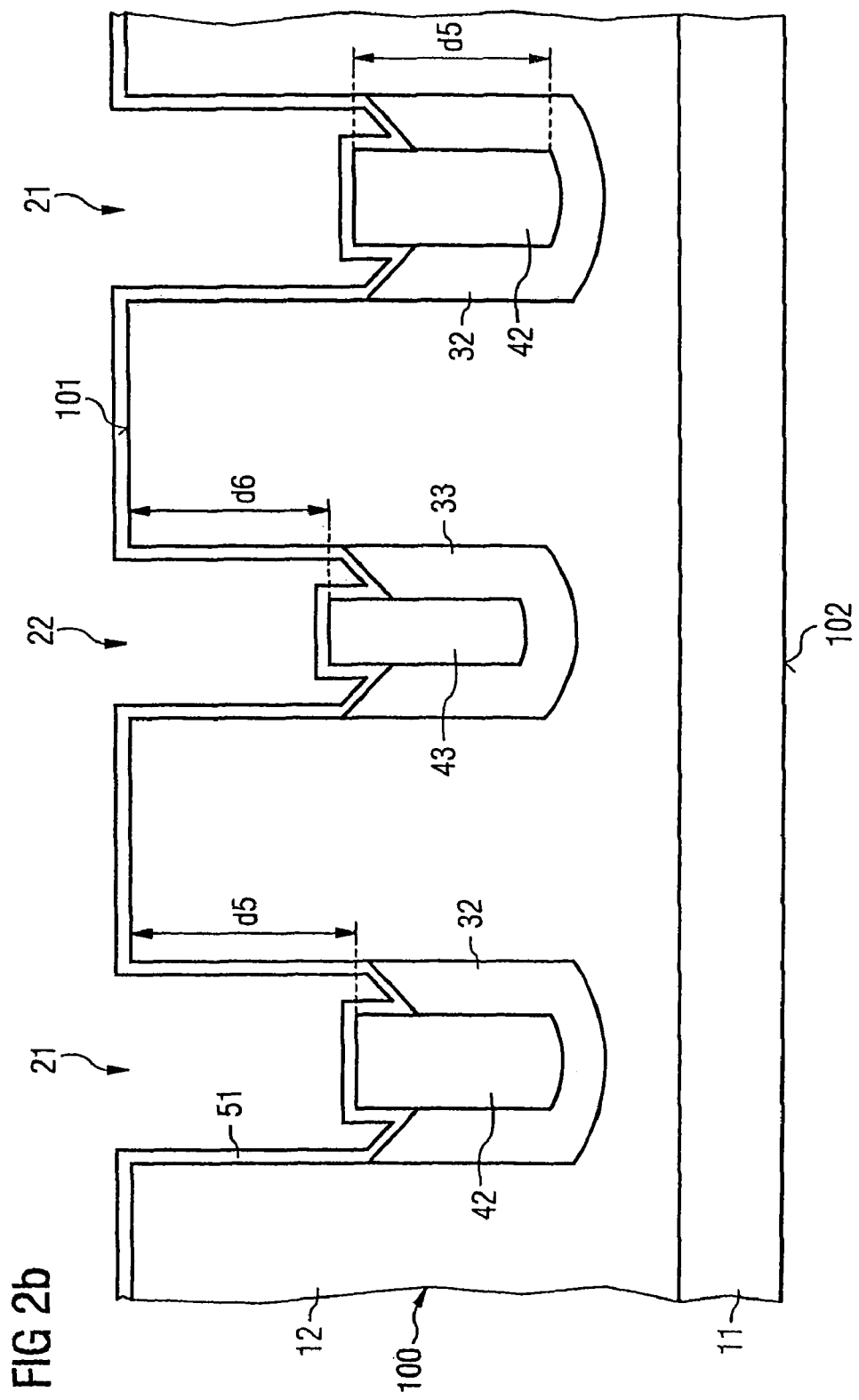

METHOD FOR PRODUCING A TRENCH TRANSISTOR AND TRENCH TRANSISTOR

CROSS-REFERENCE TO RELATED APPLICATIONS

This application claims priority from German Patent Application No. 10 2005 041 108.8-33, filed Aug. 30, 2005, which is incorporated by reference herein in its entirety.

FIELD

The invention relates to a method for producing a trench transistor which has at least one trench with a field electrode arranged in the trench and a gate electrode arranged in the trench.

BACKGROUND

Such a trench transistor and a method for producing it is described, for example, in DE 102 34 996 A1.

In such components, the gate electrode is formed adjacently to a body zone and dielectrically insulated from this body zone. The gate electrode is used in a familiar manner for forming a conductive channel in the body zone when a suitable driving potential is applied, which body zone lies between a source zone and a drift zone which forms a part of the drain zone.

The field electrode, which can be at a different potential from the gate electrode, for example at source potential, is arranged adjacently to the drift zone and dielectrically insulated from the drift zone. If the component is blocking, the field electrode is used for compensating for charge carriers in the drift zone which are the result of the doping of the drift zone, in order to increase by this means the dielectric strength of the component in the blocking case. This compensation effect of field electrodes is described, for example, in U.S. Pat. No. 4,941,026, U.S. Pat. No. 5,973,360 or U.S. Pat. No. 5,283,201.

To ensure that a conductive channel will form in the body zone when a suitable driving potential is applied to the gate electrode, it is required that the gate electrode overlaps the source zone and the drift zone or that the gate electrode at least ends precisely on the boundary between body zone and source zone and the boundary between body zone and drift zone. In this arrangement, the gate-source capacitance formed between the source zone and the gate electrode and the gate-drain capacitance formed between the drift zone and the gate electrode are increased as the overlap increases, which has a negative effect on the switching speed of the component. If, in contrast, the gate electrode does not reach the boundary between body zone and source zone or body zone and drift zone, respectively, starting from the body zone, the aforementioned gate capacitances are reduced but the turn-on resistance is increased with a given driving potential or, respectively, the driving potential must increase to values higher than the starting voltage in order to still form a conductive channel. In the extreme case, when the distance between the end of the body zone and the gate electrode is too large, the formation of a conductive channel is completely prevented.

The distance between the gate electrode and the boundaries of the body zone to the adjacent source and drift zones can be adjusted via process parameters during the production of the component. Production processes for semiconductor components are unavoidably subjected to fluctuations which must be taken into consideration during the design of the component.

Thus, for example during the production of a trench MOSFET, the relative position of the lower end of the gate electrode can fluctuate by a production-related tolerance with respect to the boundary between body zone and drift zone. To prevent the creation of a component in which the gate electrode does not reach the boundary between body zone and drift zone, the components are dimensioned in such a manner that gate electrode overlaps the drift zone at least by the dimension of this tolerance. However, this overlap leads to an increased gate-drain capacitance in components in which the maximum process tolerances are not reached.

A dimension figure for MOSFETs which is to be optimized with regard to switching losses and switching speed is the surface-independent product, i.e. the product related to the transistor surface, of the turn-on resistance Ron and the gate-drain capacitance. This dimension figure is also called the "Figure of Merit" (FOM).

SUMMARY

It would be advantageous to provide a method for producing a trench MOSFET optimized with regard to turn-on resistance and gate-drain capacitance and a trench MOSFET optimized with regard to turn-on resistance and gate-drain capacitance.

A method for producing a trench transistor according to an embodiment of the invention provides for providing a semiconductor body with a first and a second side and creating at least one first trench and at least one second trench which are arranged spaced apart from one another and which in each case extend into the semiconductor body starting from one side. The at least one first trench has a first trench width and the at least one second trench has a second trench width which is less than the first trench width.

The at least one first and the at least one second trench are produced during the same method steps.

A dielectric layer is then applied to exposed surfaces of the first and second trench and the first and second trenches are filled with an electrode material up to an identical height. Following this, the electrode material is partially removed from the at least one first and at least one second trench by applying an etching process in which an etching agent acts on the electrode material for a predetermined etching period in order to create a first field electrode in the first trench and a second field electrode in the second trench.

This production of the first and second field electrodes is followed by method steps for producing first and second gate electrodes in the first and second trench above the first and second field electrode, which are insulated from the semiconductor body by a gate dielectric layer.

The lesser trench width of the second trench in comparison with the trench width of the first method leads to the space filled up with electrode material within the at least one second trench now being narrower in a lateral direction of the semiconductor body than the space filled up with electrode material within the first trench. The surface of the electrode material exposed during the etching process is thus less within the second trench than within the first trench. This surface which can be attacked by the etching agent used during the etching process, in turn, influences the etching depth which can be achieved within a given etching period. The rule is that the etching depth decreases with decreasing "etching surface". After conclusion of the etching process, the lesser trench width of the second trench leads to the depth of an opening in the second trench above the second field electrode being less than the depth of an opening in the first trench above the first field electrode. These openings determine the dimensions of the first and second gate electrodes, the result being that the second gate electrode in the second trench extends to a lesser depth into the semiconductor body in the vertical direction than the first gate electrode in the first trench.

In the completed component, the gate electrodes are arranged adjacently to a body zone which lies between a source zone and a drift zone. It is possible in this case to produce the body zone and the source zone only after the gate electrodes have been produced, for example by means of an implantation method. The source zone is arranged in the area of the side, starting from which the trenches extend into the semiconductor body.

The different depth of the first and second gate electrodes in the first and second trenches automatically occurring due to the different width of the first and second trenches in the method leads to the first and second gate electrodes overlapping the drift zone by a different amount, wherein the first gate electrode, with respect to the boundary between body zone and drift zone, is produced in such a manner that the first gate electrode still overlaps the drift zone even when process tolerances are taken into consideration, or ends at the level of the boundary between body zone and drift zone. Because of the lesser depth of the second gate electrode, this second electrode overlaps the drift zone by a lesser amount so that the gate-drain capacitance is lower in the area of the second gate electrode.

Because of the lesser overlap between the second gate electrode and the drift zone, the turn-on resistance of the component is higher in the area of the second gate electrode. However, the turn-on resistance does not increase by the same amount as the gate-drain capacitance decreases when the overlap between gate electrode and drift zone is reduced, so that, in the component according to the embodiment of invention, the dimension figure FOM initially explained, which corresponds to the surface-independent product of turn-on resistance and gate-drain capacitance, is smaller than in a conventional component which only has gate electrodes corresponding to the first gate electrode of the component according to the embodiment of invention.

In the case where the first gate electrode is produced in such a manner that the first gate electrode overlaps the drift zone by a process-related tolerance value, the first gate electrode ends at the level of the boundary between body zone and drift zone at maximum process tolerance. In this case, it may happen that the second gate electrode ends already above this boundary between body zone and drift zone. In the area of the second gate electrode, this can lead to an increased turn-on resistance and there is a transition region for the distance between the second gate electrode and the drift zone for which the turn-on resistance and the also starting voltage do not increase or only increase by a small amount.

The trench transistor according to at least one embodiment of the invention has at least one first and at least one second trench which are arranged spaced apart from one another and which in each case extend into a semiconductor body in a vertical direction starting from a first side. In the first trench, a first field electrode is arranged and in the second trench, a second field electrode is arranged which are in each case arranged adjacently to a drift zone of the first type of conduction and which are electrically insulated from the semiconductor body. In the first trench, a first gate electrode is also arranged and in the second trench, a second gate electrode is also arranged, wherein the gate electrodes are in each case dielectrically insulated from the semiconductor body and arranged adjacently to a body zone of the second type of conduction. The first gate electrode arranged in the at least one first trench is formed in such a manner that it overlaps the drift zone by a greater amount than the second gate electrode arranged in the second trench.

The above described features and advantages, as well as others, will become more readily apparent to those of ordinary skill in the art by reference to the following detailed description and accompanying drawings.

BRIEF DESCRIPTION OF THE DRAWINGS

Unless otherwise specified, identical reference symbols in the figures designate identical component areas having the same significance.

DESCRIPTION

Figure 1A:
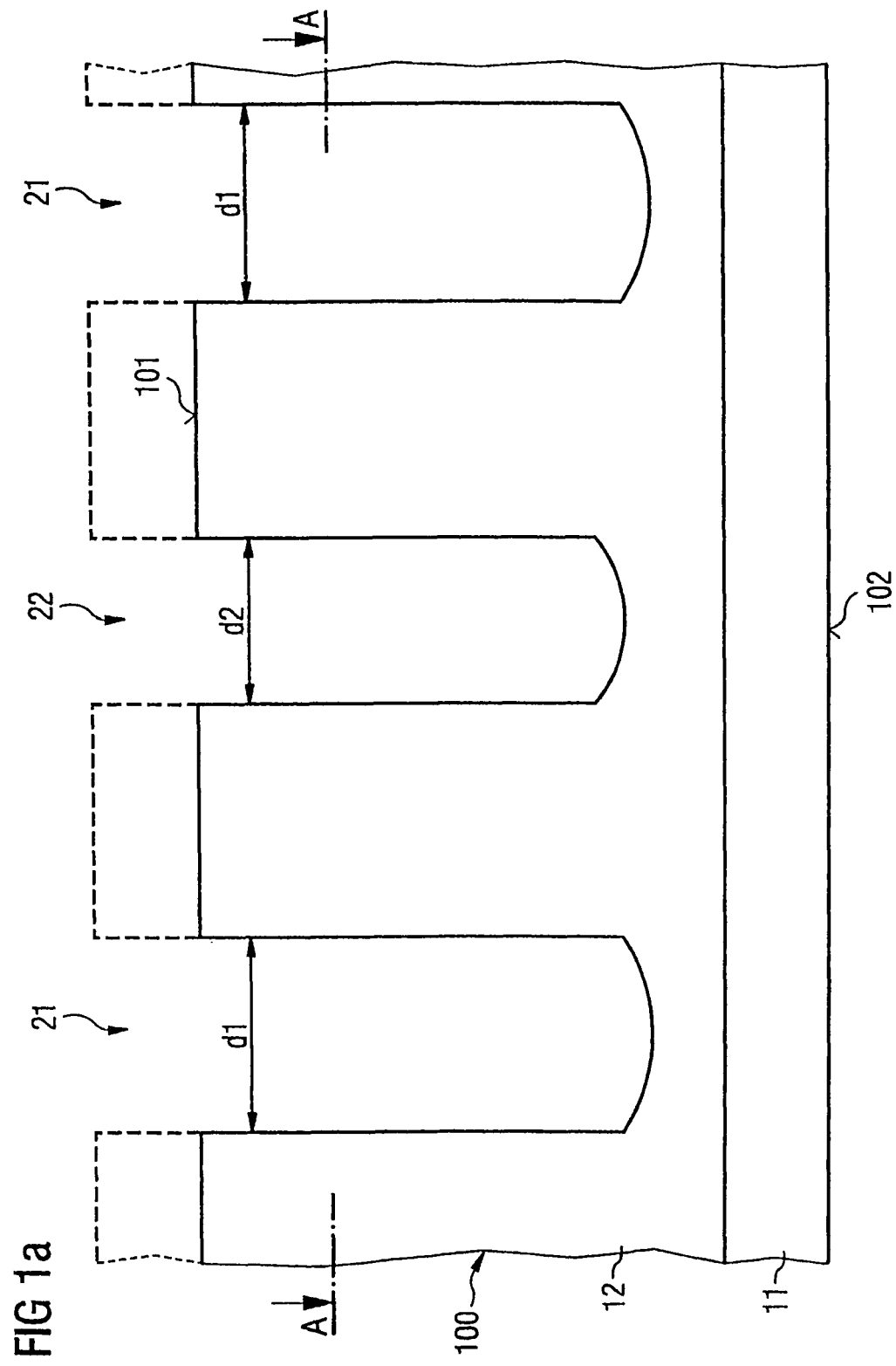
FIG. 1 illustrates method steps for producing first and second field electrodes in first and second trenches, arranged spaced apart from one another, of different width in a semiconductor body.

FIG. 1a shows a semiconductor body 100 with a first side 101 which will be called front in the text which follows, and a second side 102 which will be called rear in the text which follows, after performing first method steps for producing field electrodes in the first and second trenches 21, 22 of a semiconductor body 100. For this purpose, first and second trenches 21, 22 are introduced into the semiconductor body 100 spaced apart from one another, starting from the front 101, FIG. 1a showing two first trenches 21 and a second trench 22.

These first and second trenches 21, 22 are produced in such a manner that the first trenches 21 exhibit in a first lateral direction of the semiconductor body 100 a first trench width d1 which is wider than a second trench width d2 of the second trenches 22. The distance between two adjacent trenches 21, 22 may be equally large in each case.

The trenches 21, 22 are produced, for example, by applying a patterned etching mask 200 (shown dashed) to the front 101 and performing an etching step in which an etching agent acts for a predetermined period of time on the areas of the semiconductor body 100 which are exposed by the etching mask 200. The etching process is, in particular, an anisotropic etching process so that semiconductor material is only removed in a vertical direction of the semiconductor body 100 starting from the front.

Figure 1B:
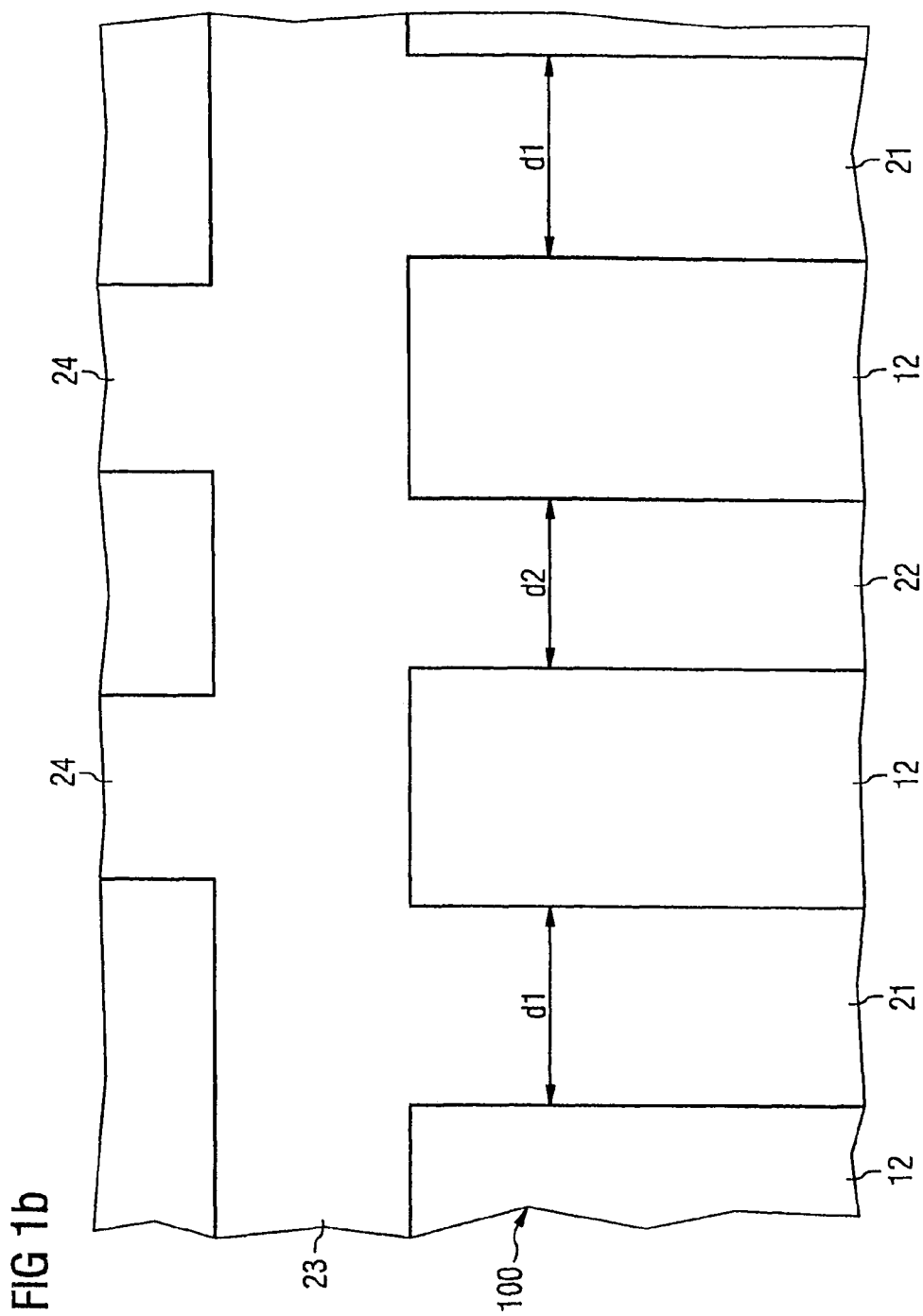

FIG. 1b shows a cross section through the semiconductor body 100 in a sectional plane A-A drawn in FIG. 1a. As shown in this FIG. 1b, the first and second trenches 21, 22 are joined by a third trench 23, extending transversely to the first and second trenches 21, 22, which can be joined by further trenches 24 in a second lateral direction which corresponds to a longitudinal direction of the first and second trenches 21, 22. Field electrodes and gate electrodes which are produced in the first and second trenches 21, 22 in the manner explained in the text which follows are correspondingly produced in the third trench, as a result of which the field electrodes in the first and second trenches 21, 22 are electrically conductively connected to one another and the gate electrodes in the first and second trenches 21, 22 are electrically conductively connected to one another. The field electrodes and gate electrodes produced in the first and second trenches 21, 22 can then be electrically contacted via the third trenches.

The subsequent discussion is restricted to a representation of the conditions in the first and second trenches 21, 22 and it must be pointed out that the width of the third trench, in particular can correspond to the first trench width d1 so that the cross-sectional representations of the first trenches 21, 22 shown and explained in the text which follows also correspond to a cross section through the third trench 23.

Figure 1C:
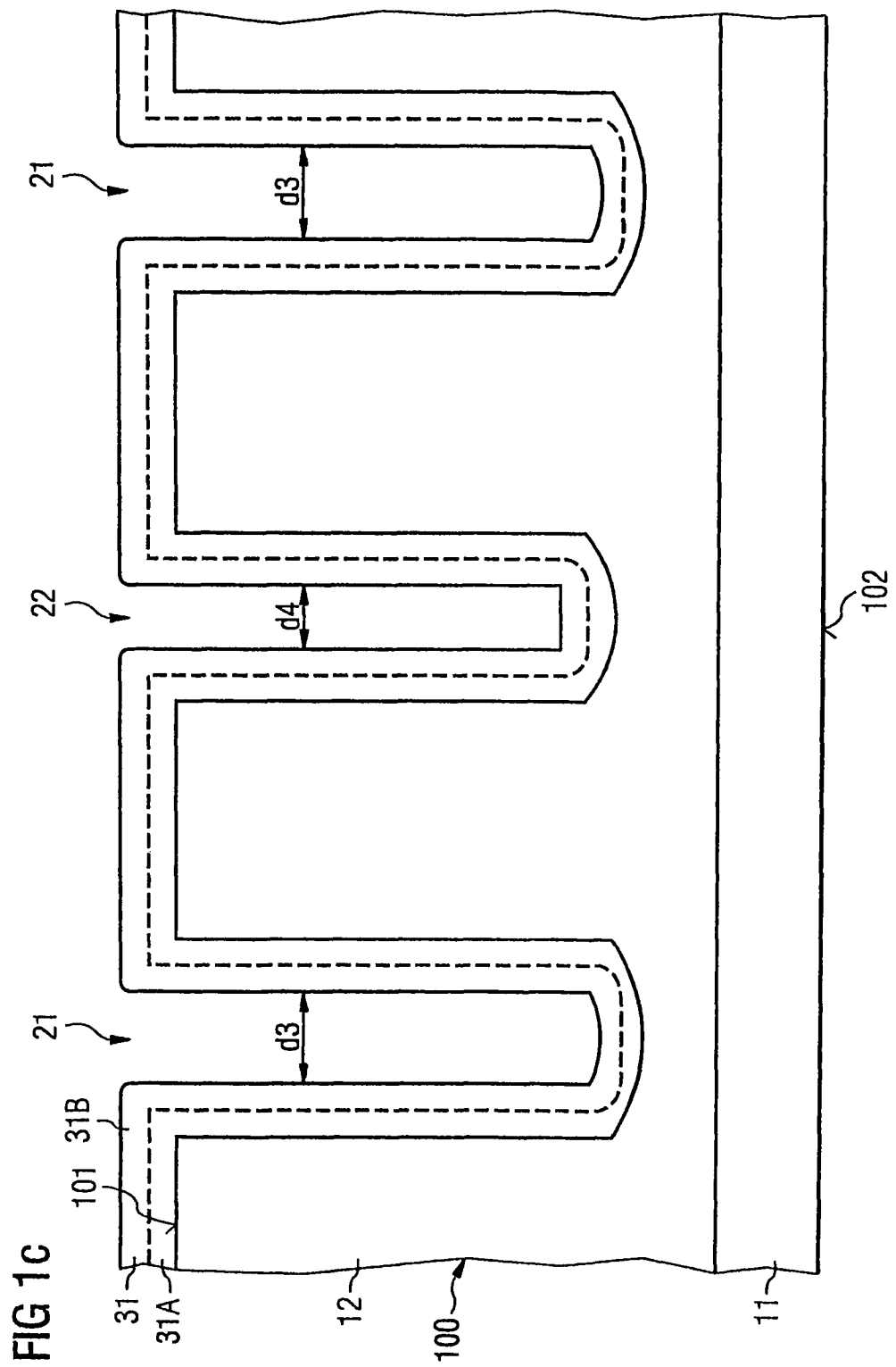

FIG. 1c shows the semiconductor body 100 in cross section after further method steps have been performed by means of which a first dielectric layer 31 is created on exposed areas of the semiconductor body 100 both in the area of the front 101 and on the side walls and on the bottom of the first and second trenches 21, 22. This dielectric layer 31 is, for example, a deposited oxide layer such as TEOS (tetraethoxysilane) or a thermal oxide layer which is produced by thermal oxidation of the semiconductor body 100. In addition, it is also possible to build up the dielectric layer 31 out of two layers 31A, 31B as is shown dashed in FIG. 1c. One of the two layers, particularly the layer directly adjoining the semiconductor body 100 can be a thermal oxide layer whereas the other one of the two layers 31B can be a deposited oxide layer.

After the dielectric layer 31 has been produced, the first and second trenches 21, 22 are filled up at least partially, but in each case up to an identical height, with an electrode material 41, the result of which is shown in FIG. 1d. In the example shown, the first and second trenches 21, 22 are completely filled up with the electrode material 41 which, in the example shown, also covers the dielectric layer 31 above the front 101 of the semiconductor body.

Filling up the first and second trenches 21, 22 with electrode material 41 produces in the first and second trenches 21, 22 electrode sections which extend into the semiconductor body 100 in the vertical direction and which are insulated from the semiconductor body 100 by the first dielectric layer 31. The electrode sections in the first trenches 21 have a first electrode width d3 in the first lateral direction of the semiconductor body 100. Because the first trench width d1 is greater than the second trench width d2, this first electrode width is greater than a second electrode width d4 exhibited by the electrode sections in the second trenches 22. In this context, it should be pointed out that the ratio between the original trench widths d1, d2 and the trench widths d3, d4 remaining after the production of the first dielectric layer 31, which correspond to the electrode widths, is dependent on how the dielectric layer 31 is produced. Thus, a wider trench remains after the production of a thermal oxide layer since the thermal oxide also expands into the semiconductor body which leads to a reduction in the width of the semiconductor region between the trenches, which is also called the mesa region. During the production of the dielectric layer 31 by means of a deposition method, a narrower trench remains since in this case dielectric material is only applied to the side walls and to the bottom of the trenches 21, 22 whereas the mesa region retains its original width. Independently of the type of production method of the dielectric layer, however, the difference d1−d2 between the first and second trench width d1, d2 corresponds to the difference d3−d4 between the first and second electrode widths d3, d4. The following thus applies:

$$d1-d2=d3-d4 \quad (1).$$

Referring to FIG. 1e, the electrode material 41 is partially removed in the first and second trenches 21, 22 by using an etching process, wherein after the etching process has been concluded, first field electrodes 42 remain in the first trenches 21 and second field electrodes 43 remain in the second trenches 22, which are in each case dielectrically insulated from the semiconductor body 100 by the first dielectric layer 31. During the etching process, an etching agent acts on exposed areas of the electrode material 41 for a predetermined etching period in order to cut back the electrode material 41 in the first and second trenches 21, 22 to the level of the first and second field electrodes 42, 43 remaining at the end. The etching process is, for example, a plasma etching process in which an etching gas such as, for example, $SF_6$ is used as etching agent. The electrode material 41 is, for example, a heavily doped polycrystalline semiconductor material such as, for example, polysilicon which can be suitably etched by the etching agent used.

The difference in trench widths of the first and second trenches and the resultant different electrode width d3, d4 leads to the electrode material 41 in the first and second trenches 21, 22 being cut back to a different width during the predetermined etching period. The basic principle is that the etching depth, that is to say the depth to which the electrode material 41 in the trenches 21, 22 is cut back during a predetermined etching period, increases with increasing width of the trenches to be etched. The extent of the trenches in their longitudinal direction does not play any role, or only a subordinate role, if at all, for the etching depth which is reached during a predetermined etching period.

The disclosed embodiment of the invention thus utilizes the fact that in conventional etching processes used for trench etching in semiconductor material, the etching rates are dependent on the required trench width and the etching rates increase with increasing trench widths. The factor responsible for this could be that the reaction products produced during the etching can be removed more easily with wider trenches.

The result is that the electrode material 41 is cut back farther in the area of the first trenches 21 than in the area of the second trench 22, as a result of which an opening in the first trench 21 above the first field electrode 42 in the vertical direction of the semiconductor body is deeper than an opening in the second trench 22 above the second field electrode 43. The depth of this opening with respect to the front 101 of the semiconductor body is designated by d5 for the first trench 21 in FIG. 1e and by d6 for the second trench 22, wherein d5>d6 in the way explained. In other words, after the etching process has been performed, a top edge of the second field electrode 43 is arranged closer to the front 101 than a top edge of the first field electrode 42.

The difference between the first distance d5 between the first field electrode 42 and the front 101 and the second distance d6 between the second field electrode 43 and the front 101 will be called Δd in the text which follows. The duration of the etching process is adjusted in such a manner that the difference of the etching depths Δd corresponds at least approximately to the difference d1−d2 of the original trench widths d1, d2. The first trench width is, for example, between 600 nm and 700 nm, the difference between the first and second trench width d1, d2 is, for example, 100 nm, so that the depths of the trenches produced after cutting back the electrode layer 41 also differ by about 100 nm.

The thickness of the first dielectric layer is, for example, between 150 nm and 200 nm, so that the trench width d3 is between 200 nm and 400 nm after the first dielectric layer 31 has been deposited. The trench width d4 is correspondingly smaller.

The method for producing the first and second field electrodes 42, 43, which are arranged spaced apart from the front 101 of the semiconductor body by different amounts, explained above, is followed by further, basically known method steps for producing gate electrodes which are arranged in the first and second trenches 21, 22 above the first and second field electrodes 42, 43. In this context, it is pointed out that the method for producing such gate electrodes above field electrodes is basically known and is described, for example, in the DE 102 34 996 A1 already explained initially.

A possible method for producing these gate electrodes will be explained by means of FIG. 2 in the text which follows.

Referring to FIGS. 2a and 2b, first method steps for producing the gate electrodes provide for producing a second dielectric layer 51 at the side walls of the first and second trenches 21, 22 above the field electrodes 42, 43 which, in particular, is thinner than the first dielectric layer 31 which dielectrically insulates the field electrodes 42, 43 from the semiconductor body 100.

Referring to FIGS. 2a and 2b, the second dielectric layer, which is used as gate dielectric or gate insulation, can be produced by first removing the first dielectric layer 31 in the first and second trenches 21, 22 from their side walls above the first and second field electrode 42, 43. A suitable method for this is, in particular, an isotropic etching process. The first dielectric layer 31 is removed in such a manner that the dielectric layer 31 is cut back in the vertical direction until below the top edges of the first and second field electrodes 42, 43. The dielectric layer is cut back in the first and second trenches 21, 22 by in each case approximately equal amounts until below the top edges of the first and second field electrodes 42, 43 which is a consequence of the isotropic etching process. Referring to FIG. 2b, this removal of the first dielectric layer 31 is followed by the production of the second dielectric layer 51. This second dielectric layer is produced, for example by thermal oxidation, by deposition of a thin oxide layer or by wet oxidation. In this process, an oxide layer is produced as second dielectric layer on the front 101 of the semiconductor body 100, on the side walls of the first and second trenches 21, 22 and also on the exposed top of the first and second field electrodes 42, 43.

Figure 2C:
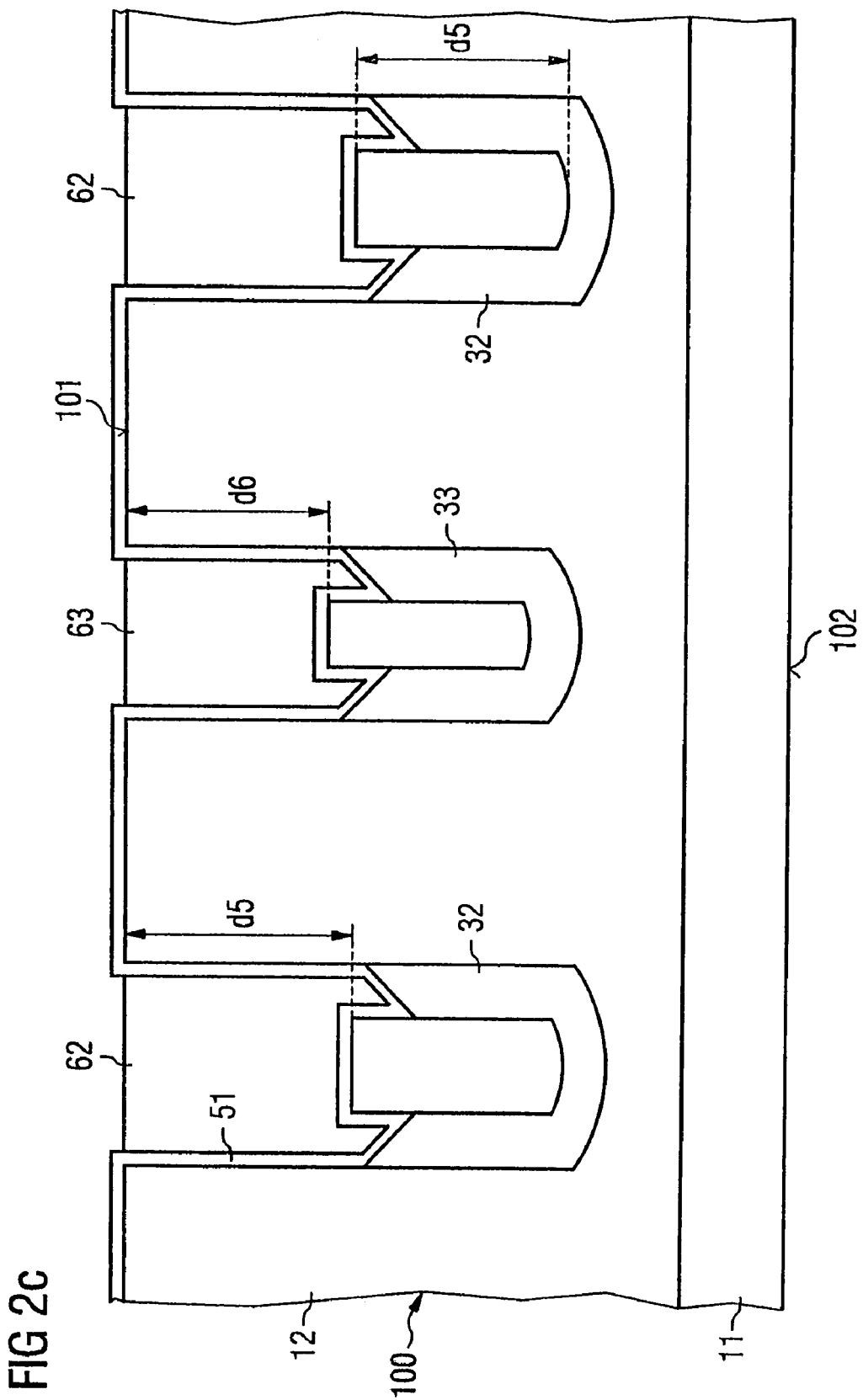
FIG. 2 illustrates further method steps for producing first and second gate electrodes in the first and second trenches above the field electrodes.

Referring to FIG. 2c, the first and second trenches 21, 22 are then filled up with a further electrode material which, for example, consists of a heavily doped polycrystalline semiconductor material such as, for example, polysilicon, in order to create by this means first and second gate electrodes 62, 63. These first and second gate electrodes 62, 63 can be produced, in accordance with the production of the field electrodes 42, 43 explained by means of FIGS. 1d and 1e, in that, firstly, an electrode layer is deposited over the entire surface, which layer also covers the gate insulation layer 51 above the front 101 of the semiconductor body, and this electrode layer is then cut back. The first and second gate electrodes 62, 63 produced extend up to the height of the front 101 or up to shortly underneath the front 101 of the semiconductor body 100 in the vertical direction.

The semiconductor body 100, which forms the starting point of the method steps for producing the field electrodes and the gate electrodes previously explained, comprises, for example, a heavily doped semiconductor zone 11 which forms the drain zone of the later trench transistor. This heavily doped semiconductor zone 11 which is formed, for example, by a semiconductor substrate, is followed by a more lightly doped semiconductor zone 12 which, section by section, forms the drift zone of the later trench transistor. This more lightly doped semiconductor zone 12 is applied to the semiconductor substrate 11, for example by means of an epitaxial process.

Figure 2D:
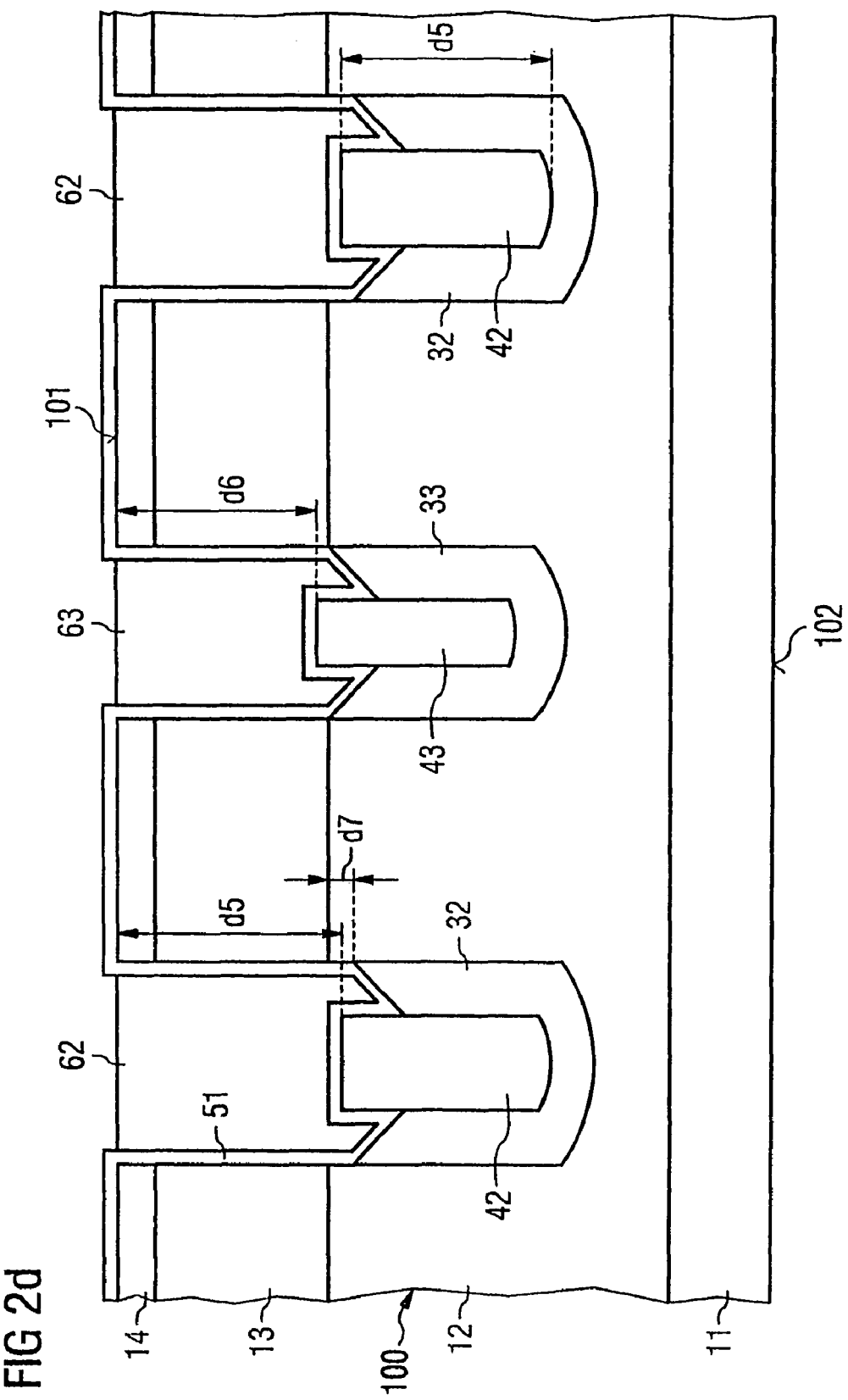

Referring to FIG. 2d, further semiconductor zones 13, 14, which form the body zone and the source zone of the trench transistor, are produced in the more lightly doped semiconductor zone 12. The body zone 13 has complementary doping to the semiconductor zone 12 forming the drift zone and complementary doping to the source zone 14. The body zone 13 is arranged between the source zone 14 and the drift zone 12 and is p-doped in the case of an n-channel MOSFET, while the source zone 14, the drift zone 12 and the drain zone 11 are n-doped. In the case of a p-channel MOSFET, these semiconductor zones correspondingly have complementary doping. The doping ratios in an IGBT correspond to the doping ratios in an n-channel MOSFET, the difference being that the drain zone 11 is p-doped.

The body zone 13 and the source zone 14 are produced, for example, by means of an implantation method, in which dopant atoms are implanted in the semiconductor body via the front 101 and are then activated by means of a temperature step. The implantation energies and the temperatures and time periods of a diffusion process following the implantation are selected in such a manner that the dopant atoms, for producing the body zone 13, penetrate deeper into the semiconductor body in the vertical direction of the semiconductor body 100, than the dopant atoms of the source zone 14 which is only produced in the area of the front 101 of the semiconductor body.

Figure 2E:
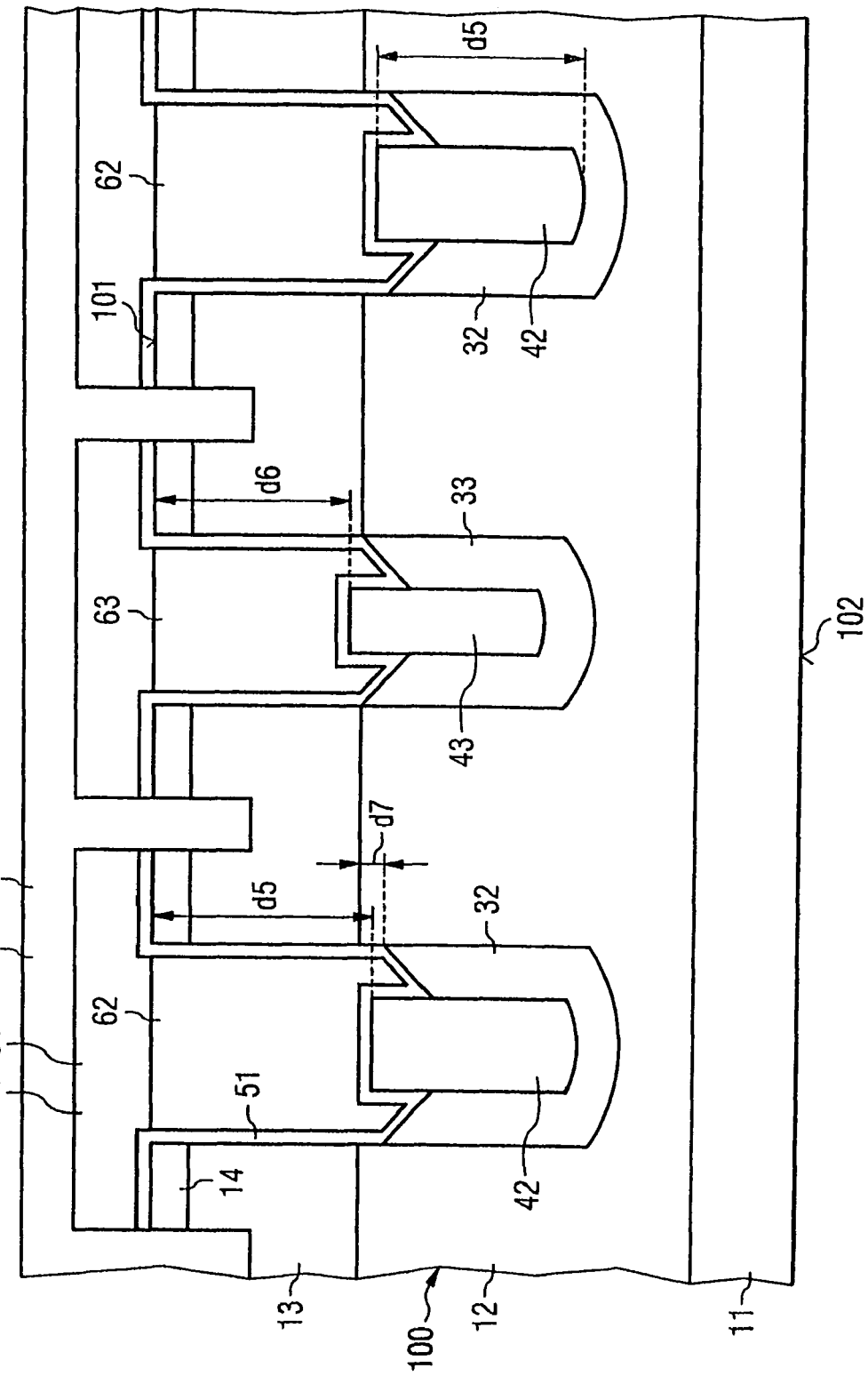

Referring to FIG. 2e, a further insulation layer or passivation layer 71 is then applied to the gate insulation layer 51 above the front 101 of the semiconductor body over the gate electrodes 62, 63. Into this insulation layer 71, contact holes are then etched which penetrate the insulation layer 71, the gate insulation 51 above the front 101 and the source zone 14 and which extend into the body zone 13. A further electrode layer 72 is then deposited which fills up the contact holes and which serves as source electrode of the component. A corresponding electrode layer which acts as drain electrode of this component is applied to the rear 102 in a manner not represented in greater detail.

In the component according to at least one embodiment of the invention, the first gate electrodes 62, starting from the front 101, extend vertically deeper into the semiconductor body than the second gate electrodes 63.

The body zone 13 is produced, adjusted to the penetration depth of the first gate electrode 62, in such a manner that the body zone 13, starting from the front 101 in the vertical direction still ends above a lower end of the first gate electrode 62, so that the first gate electrode 62 overlaps the drift zone 12 in the vertical direction, separated by the gate insulation layer 51. The length by which the first gate electrode 62 overlaps the drift zone 12 in the vertical direction is designated d7 in FIG. 2e, wherein the second gate electrode 62 extends section by section in the example shown, namely between the first field electrode 42 and the drift zone 12 until below an upper edge of the field electrode 42. The area of the first gate electrode 62 which extends below the upper edge of the first field electrode 42 forms a part of the section of the first gate electrode 62 which overlaps the drift zone 12. In this context, it should be pointed out that the gate electrodes 62 can also be produced in such a manner that they end with the top edges of the field electrodes 42, 43. In any case, the production of the body zone 13 is adjusted to the dimensions of the first gate electrodes 62 in such a manner that the first gate electrodes 62 overlap the drift zone 12 section by section in the vertical direction.

Since the second gate electrodes 63 extend to a lesser depth into the semiconductor body, starting from the front 101, and since the body zone 13 extends by an equal amount overall into the semiconductor body in the virtual direction, the area of overlap between the second gate electrodes 63 and the drift zone 12 is less than between the first gate electrodes 62 and the drift zone 12. As a result, a lower gate-drain capacitance is obtained for the second gate electrode 63 than for the first gate electrode 62, but the turn-on resistance of the component is increased in the area of the second gate electrodes 63. However, since the turn-on resistance, with a reduced overlap area, does not increase by the same amount as the gate-drain capacitance decreases, the dimension figure FOM initially explained, for the component shown in FIG. 2e is less than for a conventional component which only has gate electrodes which are dimensioned in accordance with the first gate electrodes 62 of the component according to FIG. 2e.

The difference between the penetration depths d5, d6 of the first and second field electrodes 42, 43 corresponds to the distance between the penetration depth of the first and second gate electrodes 62, 63. This difference resulting from the different etching and depths during the production of the first and second field electrodes 42, 43 approximately corresponds to the difference in trench widths d3, d4 according to FIG. 1d after deposition of the first dielectric layer 31.

The component according to at least one embodiment of the invention has a multiplicity of trenches with field electrodes 42, 43 and gate electrodes 62, 63, arranged therein, which jointly form a cell array of the component. In the component according to at least one embodiment of the invention, the turn-on resistance and the gate-drain capacitance can be adjusted via the ratio of the number of wider first trenches 62 and narrower second trenches 63. Assuming that the individual trenches are in each case equally long in a direction perpendicular to the sectional planes shown, the ratio of the numbers of first trenches 21 to the number of second trenches 22 varies between 1:1 and 4:1.

The first and second trenches can be arranged in each case alternately in the semiconductor body in a predetermined arrangement. Furthermore, the possibility exists for producing only first trenches 21 in one area of the semiconductor body and only second trenches 22 in a second area of the semiconductor body.

In addition to the above, it should be noted that the different trench widths d1, d2 of the first and second trenches 21, 22 also leads to the first trenches 21 being etched deeper than the second trenches, which, in the completed component leads to the first field electrodes 42 extending deeper into the semiconductor body than the second field electrodes 43. However, this does not affect the gate-drain capacitance of the component.

In summary, the method according to at least one embodiment of the invention provides for implementing, for the production of a trench transistor, trenches with different trench widths and then producing field electrodes by filling up the trenches with an electrode material and subsequent cutting back of the electrode material. The different trench width leads to different etching rates in the cutting back of the electrode material and thus to field electrodes which are spaced apart from a top edge of the trenches by different amounts. Following this, the gate electrodes are produced which, due to the different dimensions of the field electrodes, extend into the trenches to a different depth, resulting in different gate capacitances for the gate electrodes in the trenches of different widths.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for producing a trench transistor, the method comprising:

providing a semiconductor body including a first side and a second side;

producing at least one first trench and at least one second trench, the at least one first trench and at least one second trench arranged spaced apart from one another and extending into the semiconductor body starting from the first side of the semiconductor body;

applying a first dielectric layer to exposed surfaces of the at least one first trench and the at least one second trench;

filling the at least one first trench and the at least one second trench up to the same height with an electrode material;

partially removing the electrode material from the at least one first trench and the at least one second trench by applying an etching process in which an etching agent acts on the electrode material for a predetermined etching period, the etching process resulting in a first field electrode in the at least one first trench and a second field electrode in the at least one second trench; and producing a first gate electrode in the at least one first trench above the first field electrode and a second gate electrode in the at least one second trench above the second field electrode, the first gate electrode and the second gate electrode insulated from the semiconductor body by a gate dielectric layer;

wherein the at least one first trench defines a first trench width in a lateral direction of the semiconductor body, and wherein the at least one second trench defines a second trench width in the lateral direction of the semiconductor body, the first trench width wider than the second trench width such that, during the etching process, the electrode material in the at least one first trench is etched deeper relative to the first side of the semiconductor body than in the at least one second trench.

2. The method of claim 1 wherein the at least one first trench comprises a number of first trenches and the at least one second trench comprises a number of second trenches, wherein the ratio between the number of first trenches and the number of second trenches is between 1:1 and 4:1.

3. The method of claim 1 further comprising the step of producing at least one third trench which joins the first and second trenches.

4. The method of claim 1 wherein the first gate electrode and second gate electrode are produced in such a manner that they are arranged dielectrically insulated from the first field electrode and the second field electrode.

5. The method as claimed in one of the preceding claims, in which the gate electrodes in the first and second trenches are produced in such a manner that they are electrically conductively connected to the first and second field electrodes.

6. The method as claimed in claim 1, wherein the at least one first trench and the at least one second trench comprise a plurality of adjacent trenches, wherein the distances between adjacent trenches are in each case of equal magnitude.

7. The method of claim 1 wherein the semiconductor body includes a doped first semiconductor layer and a doped second semiconductor layer, wherein the second semiconductor layer is doped more lightly than the first semiconductor layer, and wherein the at least one first trench and the at least one second trench are produced in the second semiconductor layer.

8. The method of claim 7 wherein a semiconductor zone with complementary doping to the second semiconductor layer is produced adjacent to the first gate electrode and the second gate electrode.

9. The method of claim 1 wherein the etching process is a plasma etching process.

* * * * *